United States Patent [19]

Sakurai et al.

[11] Patent Number: 5,318,745
[45] Date of Patent: Jun. 7, 1994

[54] OXIDE SUPERCONDUCTOR AND MANUFACTURING METHOD THEREOF VIA HIP AND CONTROLLING THE OXYGEN PARTIAL PRESSURE

[75] Inventors: Takeshi Sakurai; Toru Yamashita; Hisao Yamauchi; Shoji Tanaka, all of Tokyo, Japan

[73] Assignees: International Superconductivity Technology Center; Mitsubishi Materials Corporation; Hitachi, Ltd., all of Tokyo, Japan

[21] Appl. No.: 859,414
[22] PCT Filed: Sep. 20, 1991
[86] PCT No.: PCT/JP91/01248
    § 371 Date: Jul. 8, 1992
    § 102(e) Date: Jul. 8, 1992
[87] PCT Pub. No.: WO92/05126
    PCT Pub. Date: Apr. 2, 1992

[30] Foreign Application Priority Data

Sep. 21, 1990 [JP] Japan ................. 2-250385
Jan. 14, 1991 [JP] Japan ................. 3-14684

[51] Int. Cl.$^5$ .................. H01B 12/00; B22F 3/14
[52] U.S. Cl. .................. 505/125; 505/725; 505/742; 505/491
[58] Field of Search .......... 419/49, 19, 20, 22, 419/57; 505/1, 725, 739, 742

[56] References Cited

FOREIGN PATENT DOCUMENTS 63-288912 11/1988 Japan .
1-160876  6/1989 Japan .

OTHER PUBLICATIONS

Hoi et al "Superconductivity & Its Applications", (1988), Elsevier Science Publishing Co., Ltd., B. C. Hendrix et al, Hot Isostatic Pressing (HIP) of Oxide Superconductors, pp. 94–99.
Japanese Journal of Applied Physics, vol. 29, No. 9, (1990), pp. L1632–L1634, K. Kinoshita et al, "Preparation & Superconducting Properties of $La_{2-x}(Ca_{1-y}Sr_y)_{1+x}Cu_2O_{6-x/2+\delta}$", pp. L1632–L1634.
Sakurai et al., Physica 174, (1991), 187.
Nature, vol. 345, No. 6276 (1990), R. J. Cava et al Superconductivity at 60K in $La_{2-x}$ Srx Ca $Cu_2$ $O_6$: the simplest double-layer cuprate:, pp. 602–604.
"Hot Isostatic Pressing (HIP) for the Densification of Oxide Superconductors," Tien et al. MRS: High Temperature Superconductors II, Apr. 1988.

Primary Examiner—Donald P. Walsh
Assistant Examiner—Anthony R. Chi
Attorney, Agent, or Firm—Frishauf, Holtz, Goodman & Woodward

[57] ABSTRACT

A method of manufacturing an oxide superconductor having a composition expressed by formula $La_{2-X}Sr_X$-$CaCu_2O_6$ ($0<X\leq0.6$), comprising the steps of: preliminarily burning a raw powder having a predetermined composition, and sintering the powder to obtain a sintered body; and subjecting the sintered body to hot isostatic pressing at a temperature falling within a range of from 940°–1600° C. under total pressure of 10 MPa or more and oxygen partial pressure of 2 MPa or more. By virtue of the step of subjecting the sintered body to hot isostatic pressing, a superconductor can be manufactured at a temperature and under a pressure within respective wide ranges. Further, the composition of the superconductor can be selected within a wide range of $0<X\leq0.6$. Moreover, the superconductor can be manufactured by performing quenching after the hot isostatic pressing.

19 Claims, 6 Drawing Sheets

OXIDE SUPERCONDUCTOR AND MANUFACTURING METHOD THEREOF VIA HIP AND CONTROLLING THE OXYGEN PARTIAL PRESSURE

TECHNICAL FIELD

This invention relates to a method of manufacturing an oxide superconductor, and more particularly to a method of manufacturing an oxide superconductor having a composition expressed by formula $La_{2-x}Sr_xCaCu_2O_6$ ($0 < x \leq 0.6$).

BACKGROUND ART

One of oxide superconductors having compositions expressed by formula $La_{2-x}Sr_xCaCu_2O_6$, which has a composition of $La_{1.6}Sr_{0.4}CaCu_2O_6$, is manufactured by a known method. In the method, predetermined raw materials such as nitrate, oxalate, and oxide are mixed to form a mixture having a predetermined composition, and then the mixture is preliminarily burned in a flow of oxygen at 900° C. for 40 hours. Thereafter, the mixture is sintered in the same atmosphere at 925° C. for 72 hours. The resultant sintered body is received in a cooled quartz tube, and then sealed in an airtight manner. This tube is heated at 970° C., thereby making a pressurized atmosphere of 20 atm (i.e., 2 MPa) by using thermal expansion of oxygen condensed at the time of cooling the tube. The sintered body is kept in the pressurized atmosphere for 48 hours, and then is cooled at 850° C., 750° C., 650° C. and 500° C., successively, in units of five hours. Through these steps, a superconductor having a critical temperature of 50K or more is obtained (see R. J. Cava, Nature Vol. 345 (1990), pp. 602-604).

In the above-described method of manufacturing a superconductor, only a single manufacturing condition is disclosed, under which steps from the preliminary burning to the treatment in a pressurized atmosphere are performed. Further, the composition which the method can make superconductive is limited to $La_{1.6}Sr_{0.4}CaCu_2O_6$, and hence any other composition (i.e., wherein the value of the Sr content x differs from that of the former composition) cannot have superconductivity.

In addition, in a case where a superconductive ceramic is produced by the above method, at least as long as 223 hours are required for performing the steps from the preliminary burning to the treatment in a pressurized atmosphere. Also, since a quartz tube is used for receiving a sintered body in an airtight manner, a batch of composite is greatly limited. Since the treatments are performed under only a single manufacturing condition, temperatures and pressures must be controlled with accuracy.

DISCLOSURE OF INVENTION

This invention has been made to solve the above problems, and provides a method of manufacturing, at a temperature and under a pressure within respective wide ranges, a superconductor from an oxide, which has a composition expressed by formula $La_{2-x}Sr_xCaCu_2O_6$ and falling within a wide range of $0 < X \leq 0.6$, thereby shortening the manufacturing time and increasing the amount of products.

The method of the invention which is for manufacturing an oxide superconductor having a composition expressed by formula $La_{2-x}Sr_xCaCu_2O_6$ ($0 < X \leq 0.6$), comprising the steps of: preliminarily burning a raw powder having a desired composition, and sintering the powder to obtain a sintered body; and subjecting the sintered body to hot isostatic pressing at a temperature falling within a range of from 940°-1600° C. under a total pressure of 10 MPa or more and an oxygen partial pressure of 2 MPa or more. This method provides an oxide superconductor having a composition expressed by formula $La_{2-x}Sr_xCaCu_2O_6$ ($0 < X \leq 0.6$), containing $Ca \leq 0.25$ and $Sr \leq 0.15$ in $2a$ sites, and $La \leq 0.2$ and $Sr \leq 0.2$ in $4e$ sites, and having a superconductive critical temperature of 50K or more. The reason why X is limited to a value satisfying $0 < X \leq 0.6$ will be explained. If $X = 0$, that is, if the invention is applied to an oxide having a composition of $La_2CaCu_2O_6$, the oxide will not provide superconductivity. Similarly, if $X < 0.6$, i.e., if the invention is applied to an oxide having a composition of $La_{>1.4}Sr_{<0.6}CaCu_2O_6$, the oxide will not provide superconductivity. A known method may be applied to selection of raw materials or of the composition ratio thereof. For example, $La_2O_3$, $CaCO_3$, $SrCO_3$, and $CuO$ may be used as the raw materials, and mixed to have a predetermined composition. Preliminary burning and sintering of the mixture may be performed by a known method. It is preferable to perform the preliminary burning at a temperature of 850°-950° C. For example, preliminary burning performed for ten hours in the atmosphere of oxygen at a temperature of 900° C. is repeated several times. Further, sintering is performed for 24-72 hours or more in the flow of oxygen at a temperature of e.g. 925°-1200° C. It is preferable to perform the sintering treatment at a high temperature of e.g. 900°-970° C. if previous hot isostatic pressing is performed at a lower temperature of e.g. 940°-1070° C. within the claimed range of 940°-1600° C. On the other hand, if the hot isostatic pressing is performed at a higher temperature of e.g. 1070°-1600° C., the sintering treatment temperature can be set to a value falling within a wide range of e.g. 900°-1200° C. That is, it is preferable to set the sintering treatment temperature low if the hot isostatic pressing temperature is set high, and to set the former high if the latter is set low. The hot isostatic pressing is performed at a temperature of 940°-1600° C. under a total pressure of 10 MPa or more and an oxygen partial pressure of 2 MPa or more. Though an oxide superconductor can be obtained under temperature and pressure conditions falling outside the above-described ranges, the reason why the conditions are determined as above is that an oxide superconductor, having a composition given by formula $La_{2-x}Sr_xCaCu_2O_6$ (X falling within a wide range of more than 0 to 0.6 or less), can reliably be obtained even under other treatment conditions. In view of the above, it is desirable in the invention to set the total pressure to 100 MPa or more, the oxygen partial pressure to 20 MPa or more, and the temperature to 940°-1300° C. Quenching is performed after the completion of the hot isostatic pressing. The cooling rate is preferably 400° C. or more per hour.

BEST MODE OF CARRYING OUT THE INVENTION

The embodiment of the invention will be explained.

Figure 1:
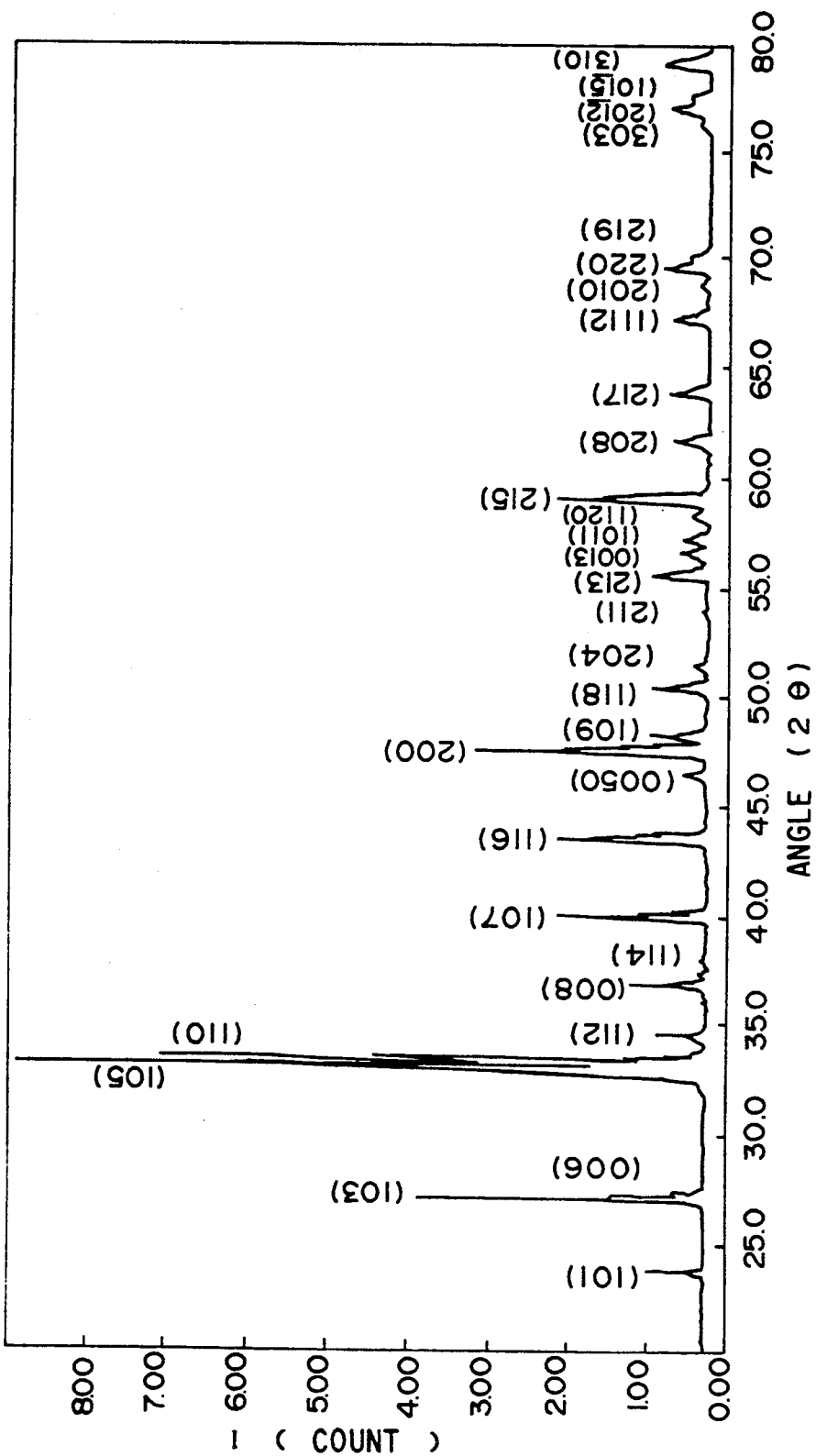
FIG. 1 is a graph, showing a powder diffraction pattern of the oxide superconductor of the invention which is obtained before a HIP treatment.
Figure 2:
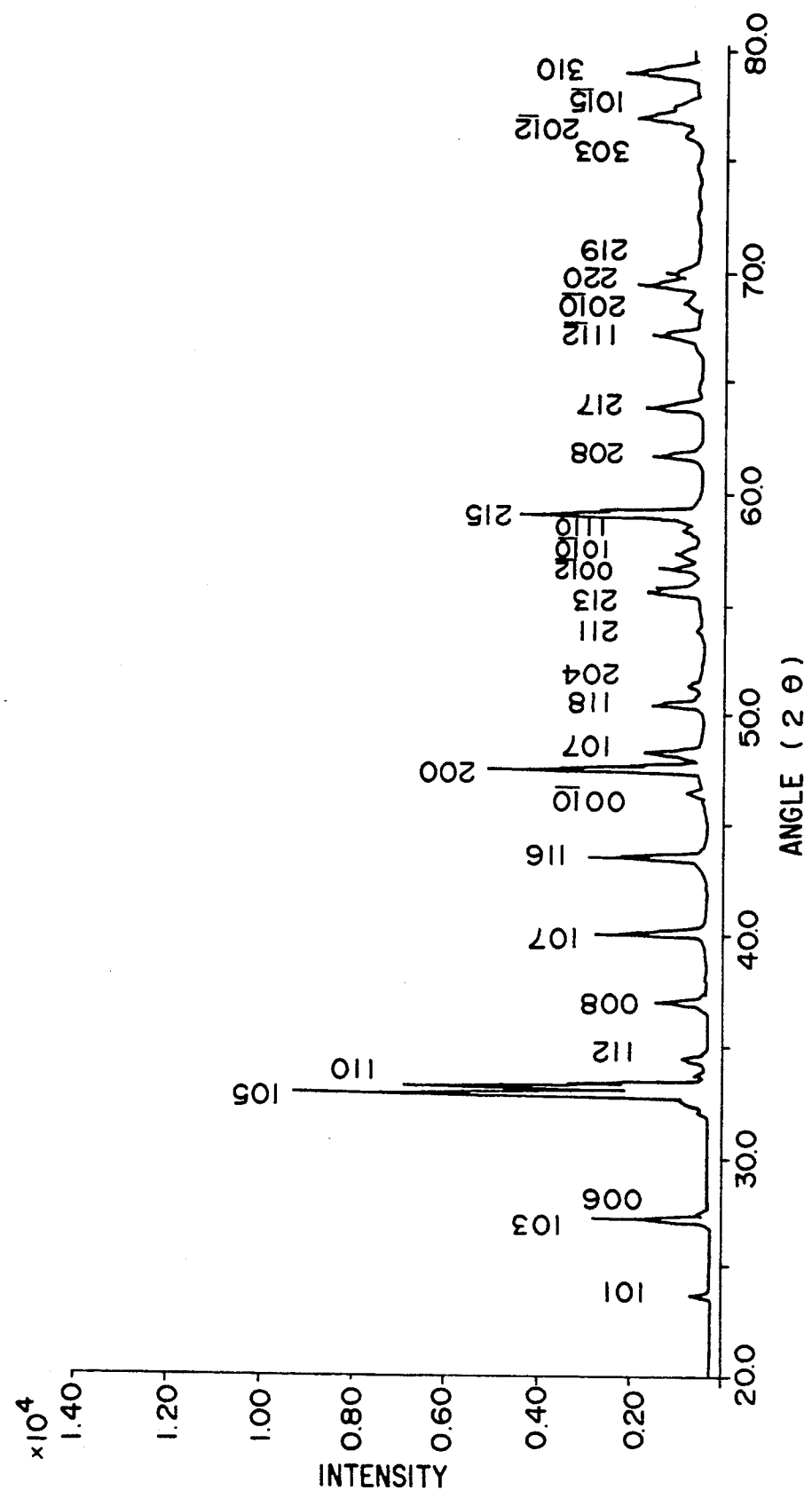
FIG. 2 is a graph, showing a powder diffraction pattern of an oxide superconductor of the invention which is obtained after a HIP treatment.
Figure 3:
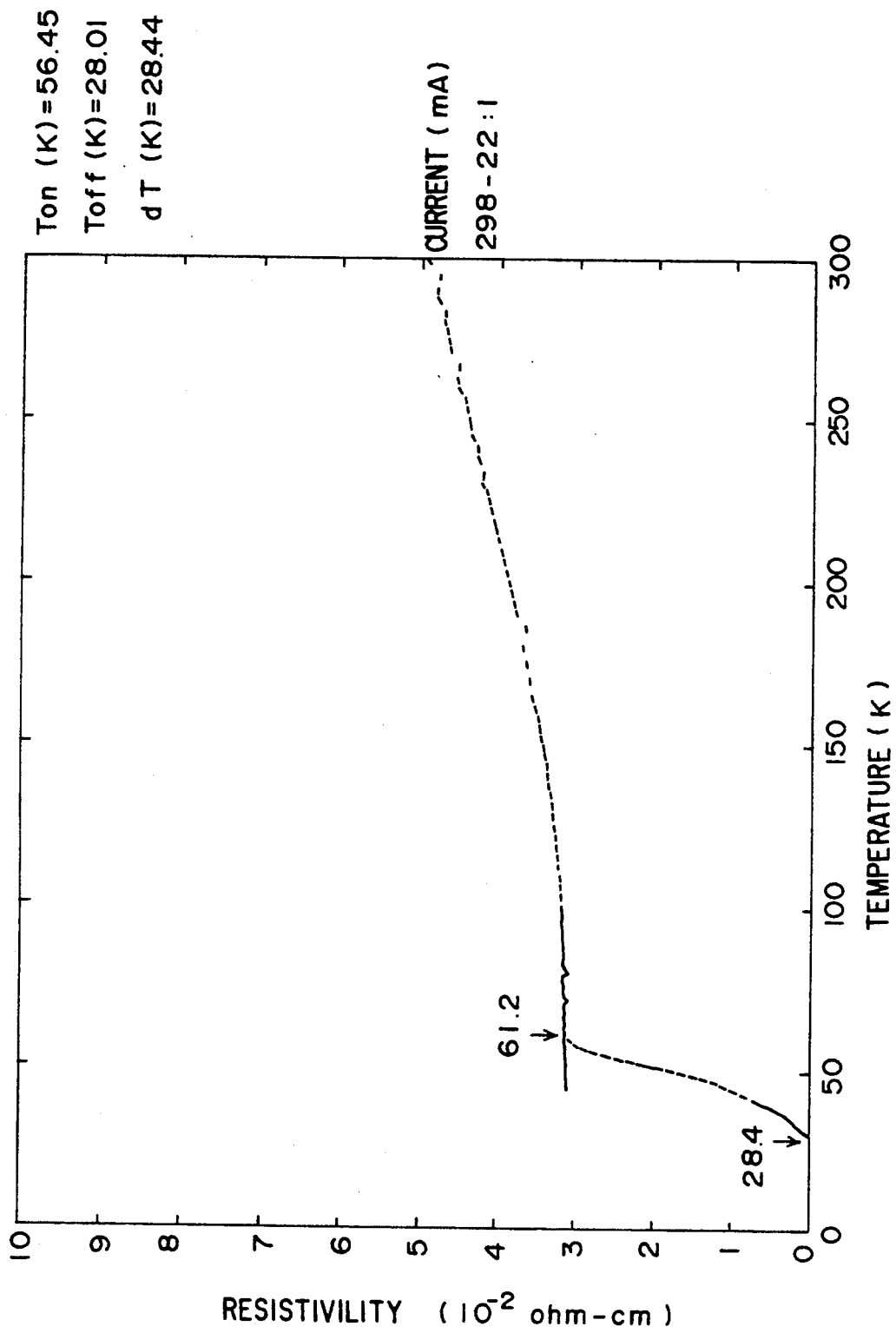
FIG. 3 is a graph, showing a change in the resistance of the oxide superconductor of the invention due to a change in the temperature of the same.
Figure 4:
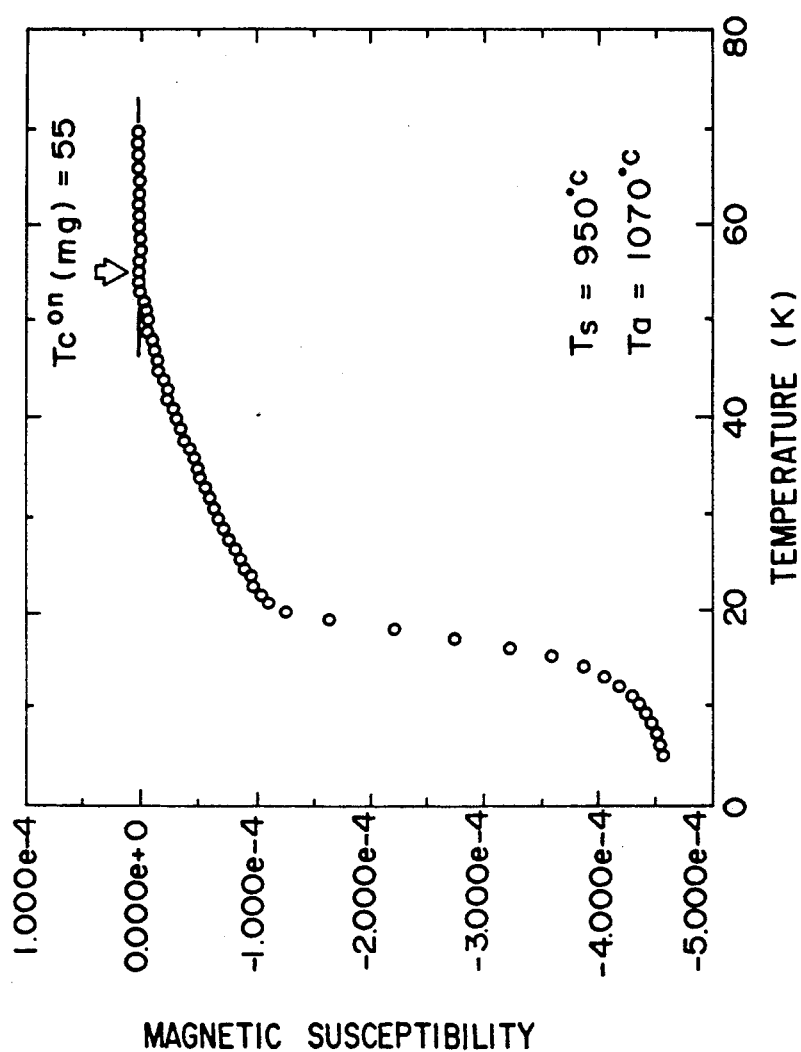
FIG. 4 is a graph, showing a change in the magnetic susceptibility of the oxide superconductor of the invention due to a change in the temperature of the same.

Samples 1-7 were prepared by a 15-hour wet blending of $La_2O_3$, $CaCO_3$, $SrCO_3$, and $CuO$ as raw materials. The samples 1-7 had compositions expressed by $La_{2-x}Sr_xCaCu_2O_6$ (X=0, 0.05, 0.1, 0.2, 0.4, 0.6, and 0.7, respectively). The samples were molded after being dried, and were then subjected to preliminary burning at 900° C. in air or oxygen flow for ten hours. This preliminary burning step was repeated four times, with a pulverizing/blending step repeatedly performed therebetween. Table 1 shows the compositions of the samples (samples 2-6 accord to the invention, and samples 1 and 7 are comparative samples), while table 2 shows phases identified by X-ray diffraction. Subsequently, each of the preliminarily burned powders was molded to have a rectangular form, and then sintered at 900°-1000° C. for 26-72 hours. The sintered bodies were subjected to Hot Isostatic Pressing (HIP) in the atmosphere of Ar gas containing $O_2$ gas. Various HIP treatments were performed by varying total pressure, oxygen partial pressure, and temperature. Further, the HIP treatment was completed by cooling the resultant product after keeping it in the above atmosphere for six hours. Specifically, the cooling rate was 470° C. per hour. As a result, an oxide superconductor having a superconduction critical temperature of 50K or more could be compounded. Each of Tables 3-9 shows results of measurement performed as regards a corresponding one of the samples 1-7 obtained after various HIP treatments, in which the sintering temperature ranged from 900° C. to 1130° C., and the HIP treatment temperature from 900° C. to 1220° C. (the total pressure was kept at 100 MPa, and the oxygen partial pressure at 20 MPa). Specifically, each table shows that the onset point ($T_c{}^{ON}(R)$) obtained from the electric resistance at which transition to superconductive state is started, which is obtained from the electric resistance, that the end point ($T_c{}^{ZERO}(R)$) obtained from the electric resistance at which the transition has been completed, and that onset point ($T_c{}^{ON}(mag)$) obtained from the magnetic susceptibility at which the transition is started (table 3 relating to sample 1, however, shows only ($T_c{}^{ON}(R)$) and ($T_c{}^{ZERO}(R)$). Table 10 shows (Tc ON (R)), (Tc ZERO (R)), and ($T_c{}^{ON}(mag)$) of sample 4 which were obtained by varying the total pressure and oxygen partial pressure of the atmosphere. In the tables 3-9, the value put in a left upper portion of each box indicates Tc ON (R)), the value put in a left lower portion indicates ($T_c{}^{ZERO}(R)$), and the value in a right lower portion indicates ($T_c{}^{ON}(mag)$). The composition of each sample was identified from the diffraction pattern of the powder. For example, in a case where sample 4 was subjected to a HIP treatment performed at a temperature of 1020° C. (after sintering performed at a temperature of 925° C.), under a total pressure of 100 MPa and an oxygen partial pressure of 20 MPa, the sample provided a diffraction pattern as shown in FIG. 1, after the sintering treatment and before the HIP treatment, and provided a diffraction pattern as shown in FIG. 2 after the HIP treatment. $T_c{}^{ON}(R)$ and $T_c{}^{ZERO}(R)$ were measured by detecting a change in the resistance of the sample due to temperature. A change in the resistance of sample 4 due to temperature, for instance, is shown in FIG. 3. $T_{c\ ON}(mag)$ was measured by detecting a change in the magnetic susceptibility of the sample, which change is shown in FIG. 4.

As is shown in table 3, in a sample (X=0, which does not fall within a range according to the invention), the $La_2CuO_4$ phase had superconductivity, as is indicated by mark (x), whereas the $(La, Sr, Ca)_3Cu_2O_6$ phase did not have superconductivity which samples according to the invention had as indicated by mark ⊙. As is shown in table 4, in a sample (x=0.05, which falls within the range of the invention), the $(La, Sr, Ca)_3Cu_2O_6$ phase had superconductivity as indicated by the mark ○. As is evident from table 4, a sintered body obtained by sintering at low temperature can have superconductivity over a wide range of HIP treatment temperatures, while it is necessary to perform the HIP treatment at high temperature so as to cause a sintered body obtained by sintering at high temperature, to have superconductivity. Tables 5-8 show samples (X=0.1, 0.2, 0.4, and 0.6, respectively). As is shown in these tables, the samples provided the same results as obtained in the case of the sample (X=0.05). Further, as is evident from table 9, in a sample (X=0.7, which falls outside of the range of the invention), the $(La, Sr)_2CuO_4$ phase had superconductivity, as is indicated by mark ●, whereas the $(La, Sr, Ca)_3Cu_2O_6$ phase did not have superconductivity which samples according to the invention had as indicated by mark ⊙. As is evident from table 10, an oxide can have superconductivity when it is subjected to a HIP treatment performed under any total pressure and oxygen partial pressure, if the pressures fall within the ranges of the invention (i.e., total pressure <10 MPa; oxygen partial pressure <2 MPa).

Figure 5:
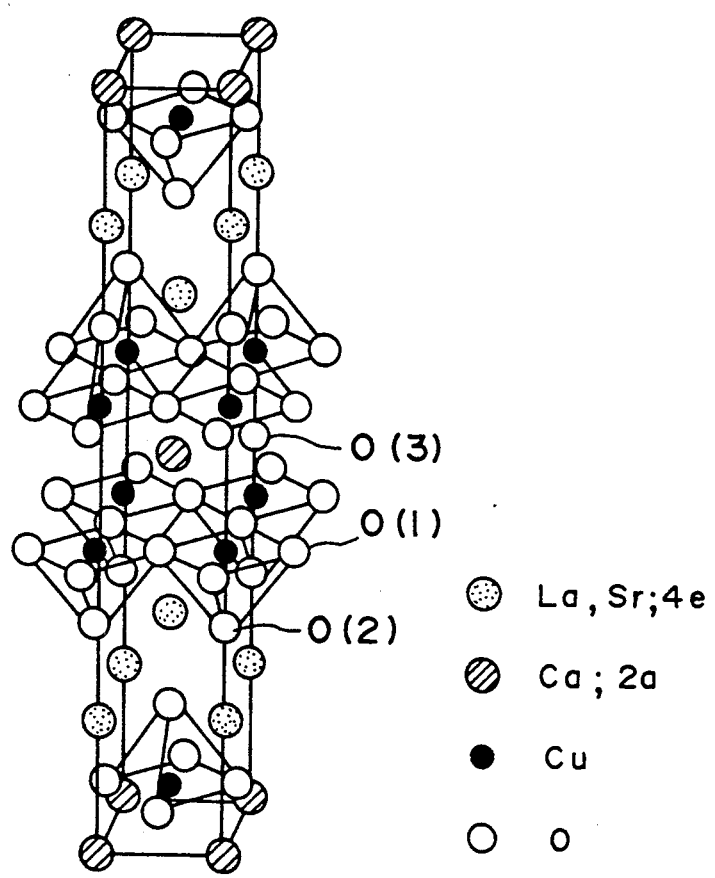
FIG. 5 is a view, showing a theoretical structure of the composition of the oxide superconductor of the invention.

Then, the inventors identified the crystal structure of an oxide superconductor obtained by the method of the invention. It is theoretically assumed that the crystal structure of the $(La, Sr)_2Cu_2O_6$ having superconductivity has Ca located in 4e sites and La, Sr located in 2a sites (the names of the sites are based on the international table X-ray crystallography; see FIG. 5). However, such a structure has not been identified so far, but it is reasonable to consider that La, Sr, and Ca exist in disorder to some extent. In the embodiment, precision of crystal structure factors was enhanced by the Rietveld method using data obtained by the powder X-ray diffraction, thereby determining compositions in 2a sites and 4e sites. The enhancement of the precision was performed in the following manner:

1. Determination of positions of positive ions (using an isotropic thermal oscillation parameter);
2. Determination of positions of negative ions (using an isotropic thermal oscillation parameter);
3. Enhancement of precision of anisotropic thermal oscillation parameter for the positive ions;
4. Enhancement of precision of anisotropic thermal oscillation parameter for the negative ions (make the parameter to converge up to Rwp=6.39%);

5. Fixing the parameters determined in the items 1–4, thereby changing the composition of the positive ions.

By the use of the above-described procedure, the compositions of the 2a sites and 4e sites are determined.

The following are measurement results as regards 5 samples (X=0.2 and 0.3).

In the case of X=0.2:

| Sample No. | Ts | Ta | t | VIII | 2a | IX | 4e | Rwp (%) |
|---|---|---|---|---|---|---|---|---|
| In the case of X = 0.2: | | | | | | | | |
| 1A | 950 | 1020 | 100 | La | 0.1 | La | 0.8735 | 5.57 |
| | | | | Sr | 0.0638 | Sr | 0.0665 | |
| | | | | Ca | 0.8362 | Ca | 0.06 | |
| 2A | 950 | 1020 | 50 | La | 0.12 | La | 0.8872 | 5.31 |
| | | | | Sr | 0.0802 | Sr | 0.068 | |
| | | | | Ca | 0.799 | Ca | 0.0448 | |
| 3A | 925 | 1120 | 6 | La | 0.129 | La | 0.885 | 6.33 |
| | | | | Sr | 0.078 | Sr | 0.063 | |
| | | | | Ca | 0.793 | Ca | 0.0523 | |
| 4A | 950 | 1020 | 6 | La | 0.114 | La | 0.8832 | 5.33 |
| | | | | Sr | 0.0824 | Sr | 0.06 | |
| | | | | Ca | 0.8036 | Ca | 0.0568 | |
| 5A | 1030 | — | 6 | La | 0.148 | La | 0.894 | 6.86 |
| | | | | Sr | 0.07 | Sr | 0.0645 | |
| | | | | Ca | 0.782 | Ca | 0.0445 | |
| In the case of X = 0.3: | | | | | | | | |
| 6A | 925 | 1170 | 6 | La | 0.189 | La | 0.755 | 9.36 |
| | | | | Sr | 0 | Sr | 0.15 | |
| | | | | Ca | 0.811 | Ca | 0.0946 | | where Ts: sintering temperature (°C.); Ta: anneal temperature (°C.); t: time, La + Sr + Ca = 1

Figure 6:
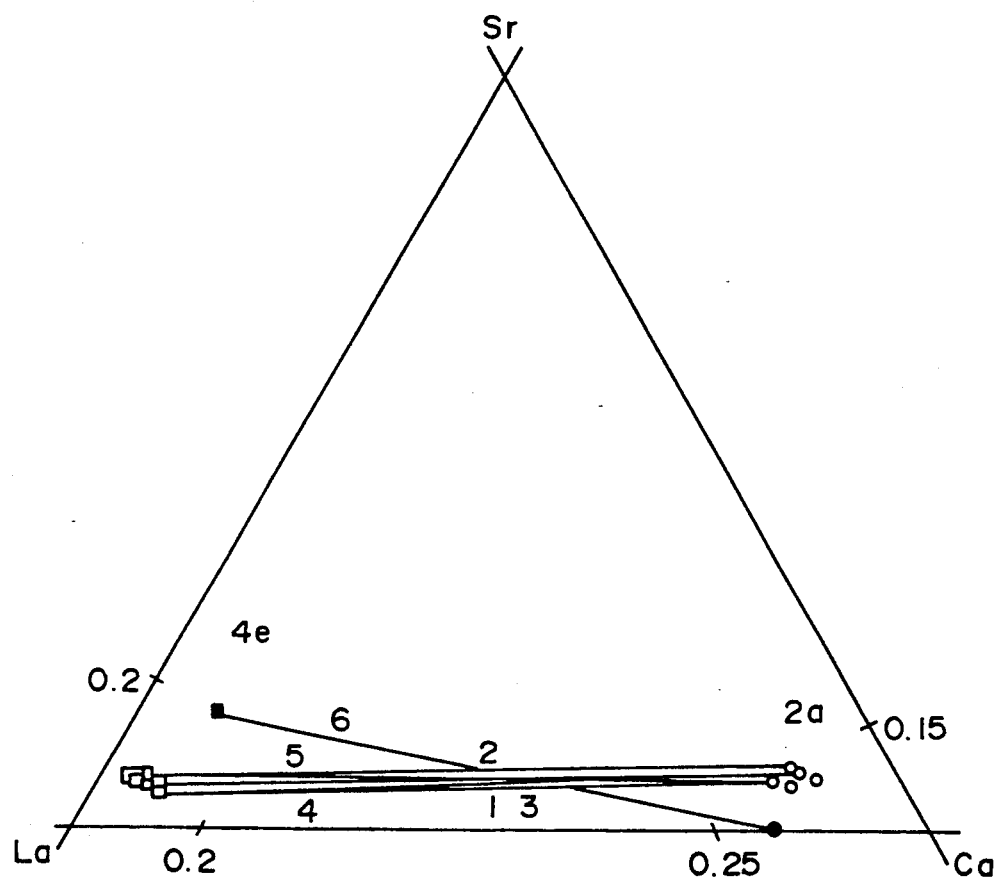
FIG. 6 is a ternary phase diagram, showing La, Sr, and Ca, samples according to the invention comprising these elements.

FIG. 6 shows the three element (La, Sr, Ca)-based crystal structure of each sample (1A–6A).

As can be understood from FIG. 6, Ca$\leq$0.25 and Sr$\leq$0.15 in the 2a sites, and La$\leq$0.2 and Sr$\leq$0.2 in the 4e sites.

The following are examples having 326 structure with precise crystal structure factors: La$_{1.9}$Ca$_{1.1}$Cu$_2$O$_6$ (F. Izumi et al: physica C 157 (1989) 89); La$_2$SrCu$_2$O$_6$ (V. Caignaert et al.: Mat. res. bull. 25 (1990) 199), and La$_{1.85}$Sr$_{1.15}$Cu$_2$O$_{6.25}$ (P. Lightfoot et al: Physica C 169 (1990) 464). These are all non-superconductors.

As described above, superconductors can be obtained by subjecting a sintered body to a HIP treatment performed at a temperature falling within a wide range, under a pressure falling within a wide range. Further, the composition of the material can have superconductivity if it satisfies 0<X$\leq$0.6. In addition, the superconductor can be produced even by abruptly cooling the material after the HIP treatment, so that the time required for production can be remarkably shortened.

TABLE 1

| | | COMPOSITIONS OF SAMPLES | | | | | |
|---|---|---|---|---|---|---|---|
| COMPOSITION No. | REAGENTS USED IN BLENDING | MOLE RATIO OF ELEMENTS FORMING SAMPLE | | | | | |
| | | La | Sr | Ca | Cu | O | |
| 1 | La$_2$O$_3$, CaCO$_3$, CuO | 2.0 | 0.0 | 1.0 | 2.0 | 6.0 | |
| 2 | La$_2$O$_3$, SrCO$_3$, CaCo$_3$, CuO | 1.95 | 0.05 | 1.0 | 2.0 | 6.0 | INVENTION |
| 3 | La$_2$O$_3$, SrCO$_3$, CaCO$_3$, CuO | 1.9 | 0.1 | 1.0 | 2.0 | 6.0 | INVENTION |
| 4 | La$_2$O$_3$, SrCO$_3$, CaCo$_3$, CuO | 1.8 | 0.2 | 1.0 | 2.0 | 6.0 | INVENTION |
| 5 | La$_2$O$_3$, SrCO$_3$, CaCo$_3$, CuO | 1.6 | 0.4 | 1.0 | 2.0 | 6.0 | INVENTION |
| 6 | La$_2$O$_3$, SrCO$_3$, CaCo$_3$, CuO | 1.4 | 0.6 | 1.0 | 2.0 | 6.0 | INVENTION |
| 7 | La$_2$O$_3$, SrCO$_3$, CaCo$_3$, CuO | 1.3 | 0.7 | 1.0 | 2.0 | 6.0 | INVENTION |

TABLE 2

RESULTS OF X-RAY DIFFRACTION MADE TO IDENTIFICATE STRUCTURAL PHASE OF SAMPLE OBTAINED AFTER PRELIMINARY BURNING

| COMPOSITION No. | PHASE IDENTIFIED BY X-RAY DIFFRACTION |
|---|---|
| 1 | (La, Ca)$_3$Cu$_2$O$_6$, La$_2$CuO$_4$, CaO |
| 2 | (La, Sr, Ca)$_3$Cu$_2$O$_6$(*) |
| 3 | (La, Sr, Ca)$_3$Cu$_2$O$_6$(*) |
| 4 | (La, Sr, Ca)$_3$Cu$_2$O$_6$(*) |
| 5 | (La, Sr, Ca)$_3$Cu$_2$O$_6$(*) CaO |
| 6 | (La, Sr, Ca)$_3$Cu$_2$O$_6$(*) CaO |
| 7 | (La, Sr)$_2$CuO$_4$, (La, Sr)$_3$Ca$_2$O$_6$, CaO |

(*)THE INVENTION WILL MAKE (La, Sr, Ca)$_3$Cu$_2$O$_6$ PHASE SUPERCONDUCTIVE.

TABLE 3

| | SINTERING TEMPERATURE (C.°) | | | | | | |
|---|---|---|---|---|---|---|---|
| | 900 | 925 ⊗ | 950 | 970 | 1000 | 1030 | 1030 | 1130 |
| COMPOSITION No. 1 | $T_{c(T)}^{on}$ | | | | | | |
| La$_{2.0}$Sr$_{0.0}$ | $T_{c(R)}^{zero}$ | | | | | | |
| CaCu$_2$O$_6$ | $T_{c(mag)}^{on}$ | | | | | | |
| HIP TREATMENT TEMPERATURE (°C.) | | | | | | | |
| 1220 | 40.9 | 41.6 | | 39.9 | | 37.2 | 30.2 |
| | 24.3⊗ | 23.4⊗ | | 20.7⊗ | | 19.0⊗ | 16.7⊗ |
| 1170 | | | | | | | |
| 1120 | 40.6 | 41.7 | | | | | |
| | 20.6⊗ | 20.1⊗ | | | | | |
| 1070 | 40.2 | 41.8 | | 43.3 | | 35.4 | 25.4 |
| | 18.9⊗ | 19.4⊗ | | 20.9⊗ | | 10.3⊗ | <4.2⊗ |
| 1020 | | | | | | | |
| 970 | 30.6 | 35.1 | | 20.9 | NON-SUPER-CONDUCTION | | |
| | 7.9⊗ | 6.7⊗ | | <4.2⊗ | | | |
| 920 | | | | | | | |
| 900 | 25.1 | NON-SUPER-CONDUC- | NON-SUPER-CONDUC- | | NON-SUPER-CONDUCTION | | NON-SUPER-CONDUC- |
| | <4.2⊗ | | | | | | |

TABLE 3-continued

| COMPOSITION No. 1<br>$La_{2.0}Sr_{0.0}$<br>$CaCu_2O_6$ | SINTERING TEMPERATURE (C.°) | | | | | | | |
|---|---|---|---|---|---|---|---|---|
| | 900 | 925<br>$T_{c(T)}{}^{on}$<br>$T_{c(R)}{}^{zero}$<br>$T_{c(mag)}{}^{on}$ | 950 | 970 | 1000 | 1030 | 1030 | 1130 |
| | | | TION | TION | | | | TION |

⊗: SUPERCONDUCTION BY $La_2CuO_4$ PHASE
⊙: SUPERCONDUCTION BY $(La, Sr, Ca)_3Cu_2O_6$ PHASE
$T_{c(mag)}{}^{on}$: SUPERCONDUCTION CRITICAL TEMPERATURE OBTAINED BY MEASURING MAGNETIC SUSCEPTIBILITY (DURING COOLING IN MAGNETIC FIELD)
$T_{c(R)}{}^{on}$: ONSET POINT OBTAINED BY MEASURING ELECTRICAL RESISTANCE (AT THE TIME OF LOWERING TEMPERATURE)
$T_{c(R)}{}^{zero}$: END POINT OBTAINED BY MEASURING ELECTRICAL RESISTANCE (AT THE TIME OF LOWERING TEMPERATURE)

TABLE 4

| COMPOSITION No. 2<br>$La_{1.95}Sr_{0.05}$<br>$CaCu_2O_6$ | SINTERING TEMPERATURE (C.°) | | | | | | | |
|---|---|---|---|---|---|---|---|---|
| | 900 | 925<br>$T_{c(R)}{}^{on}$<br>$T_{c(R)}{}^{zero}$<br>$T_{c(mag)}{}^{on}$ | 950 | 970 | 1000 | 1030 | 1030 | 1130 |
| HIP TREATMENT TEMPERATURE (°C.) | | | | | | | | |
| 1220 | 43.2 40<br>25.5 ⊙ | | 44.9 42<br>25.9 ⊙ | | | 43.6 40<br>25.4 ⊙ | | 41.3 35<br>26.2 ⊙ |
| 1170 | | | 45.5 42<br>26.2 ⊙ | | | 44.9 40<br>27.1 ⊙ | | 33.9<br>11.0 ⊙ |
| 1120 | | | | | | | | NON-SUPER-CONDUCTION |
| 1070 | 40.1 36<br>22.9 ⊙ | | 40.3 38<br>23.7 ⊙ | 41.6 38<br>24.2 ⊙ | 40.9 35<br>24.6 ⊙ | 36.2 27<br>18.4 ⊙ | 22.0<br><4.2 ⊙ | NON-SUPER-CONDUCTION |
| 1020 | | | | | | NON-SUPER-CONDUCTION | | |
| 970 | 32.1 25<br>18.4 ⊙ | | 33.3 29<br>16.2 ⊙ | 33.6<br>16.8 ⊙ | NON-SUPER-CONDUCTION | | | |
| 920 | | | | | | | | |
| 900 | 20.2<br><4.2 ⊙ | | NON-SUPER-CONDUCTION | | | NON-SUPER-CONDUCTION | | NON-SUPER-CONDUCTION |

⊗: SUPERCONDUCTION BY $La_2CuO_4$ PHASE
⊙: SUPERCONDUCTION BY $(La, Sr, Ca)_3Cu_2O_6$ PHASE
$T_{c(mag)}{}^{on}$: SUPERCONDUCTION CRITICAL TEMPERATURE OBTAINED BY MEASURING MAGNETIC SUSCEPTIBILITY (DURING COOLING IN MAGNETIC FIELD)
$T_{c(R)}{}^{on}$: ONSET POINT OBTAINED BY MEASURING ELECTRICAL RESISTANCE (AT THE TIME OF LOWERING TEMPERATURE)
$T_{c(R)}{}^{zero}$: END POINT OBTAINED BY MEASURING ELECTRICAL RESISTANCE (AT THE TIME OF LOWERING TEMPERATURE)

TABLE 5

| COMPOSITION No. 3<br>$La_{1.9}Sr_{0.1}$<br>$CaCu_2O_6$ | SINTERING TEMPERATURE (C.°) | | | | | | | |
|---|---|---|---|---|---|---|---|---|
| | 900 | 925<br>$T_{c(R)}{}^{on}$<br>$T_{c(R)}{}^{zero}$<br>$T_{c(mag)}{}^{on}$ | 950 | 970 | 1000 | 1030 | 1080 | 1130 |
| HIP TREATMENT TEMPERATURE (°C.) | | | | | | | | |
| 1220 | 53.0 43<br>37.0 ⊙ | 54.6 45<br>39.9 ⊙ | 50.0 43<br>38.7 ⊙ | | 51.2 42<br>38.6 ⊙ | | 46.4 40<br>33..8 ⊙ | 42.6 37<br>28.9 ⊙ |
| 1170 | | | 56.2 45<br>37.9 ⊙ | | | | | |
| 1120 | 58.2 49<br>33.7 ⊙ | 56.4 47<br>33.6 ⊙ | 55.9 46<br>36.2 ⊙ | | 54.9 43<br>32.9 ⊙ | | 38.7 33<br>31.0 ⊙ | 20.8<br><4.2 ⊙ |
| 1070 | | | 50.7<br>26.8 ⊙ | | 52.2<br>29.9 ⊙ | | 22.9<br>8.0 | NON-SUPER-CONDUCTION |
| 1020 | 52.9 37<br>24.4 ⊙ | 54.5 40<br>23.9 ⊙ | 50.7 28<br>13.4 ⊙ | | | | | |
| 970 | 40.9<br><4.2 ⊙ | 41.8<br><4.2 ⊙ | 46.2<br>11.9 ⊙ | | NON-SUPER-CONDUCTION | | | NON-SUPER-CONDUCTION |
| 920 | | | 25.4<br><4.2 ⊙ | | | | | |
| 900 | 24.2 | | | 12.0 | NON-SUPER- | | NON-SUPER- | NON-SUPER- |

TABLE 5-continued

| | SINTERING TEMPERATURE (C.°) | | | | | | | |
|---|---|---|---|---|---|---|---|---|
| | 900 | 925 | 950 | 970 | 1000 | 1030 | 1080 | 1130 |
| COMPOSITION No. 3 $La_{1.9}Sr_{0.1}$ $CaCu_2O_6$ | $T_{c(R)}^{on}$ $T_{c(R)}^{zero}$ $T_{c(mag)}^{on}$ | | | | | | | |
| | <4.2 ⊙ | | | <4.2 ⊙ | CONDUCTION | | CONDUCTION | CONDUCTION |

⊗: SUPERCONDUCTION BY $La_2CuO_4$ PHASE
⊙: SUPERCONDUCTION BY $(La, Sr, Ca)_3Cu_2O_6$ PHASE
$T_{c(mag)}^{on}$: SUPERCONDUCTION CRITICAL TEMPERATURE OBTAINED BY MEASURING MAGNETIC SUSCEPTIBILITY (DURING COOLING IN MAGNETIC FIELD)
$T_{c(R)}^{on}$: ONSET POINT OBTAINED BY MEASURING ELECTRICAL RESISTANCE (AT THE TIME OF LOWERING TEMPERATURE)
$T_{c(R)}^{zero}$: END POINT OBTAINED BY MEASURING ELECTRICAL RESISTANCE (AT THE TIME OF LOWERING TEMPERATURE)

TABLE 6

| | SINTERING TEMPERATURE (C.°) | | | | | | | | | | | | | | | |
|---|---|---|---|---|---|---|---|---|---|---|---|---|---|---|---|---|
| | 900 | | 925 | | 950 | | 970 | | 1000 | | 1030 | | 1080 | | 1130 | |
| COMPOSITION No. 4 $La_{1.8}Sr_{0.2}$ $CaCu_2O_6$ | $T_{c(R)}^{on}$ $T_{c(R)}^{zero}$ $T_{c(mag)}^{on}$ | | | | | | | | | | | | | | | |
| HIP TREATMENT TEMPERATURE (°C.) | | | | | | | | | | | | | | | | |
| 1220 | 52.1 | 46 | 53.2 | 48 | 50.2 | 45 | | | 50.0 | 46 | | | 47.3 | 44 | 46.2 | 43 |
| | 40.0 | ⊙ | 40.1 | ⊙ | 39.6 | ⊙ | | | 39.0 | ⊙ | | | 37.9 | ⊙ | 34.5 | ⊙ |
| 1170 | | | | | 55.6 | 48 | | | | | | | 49.0 | 42 | 47.0 | 40 |
| | | | | | 40.0 | ⊙ | | | | | | | 42.6 | ⊙ | 30.6 | ⊙ |
| 1120 | 62.7 | 52 | 62.7 | 51 | 58.9 | 48 | | | 56.7 | 51 | | | | | 42.9 | 30 |
| | 41.1 | ⊙ | 40.6 | ⊙ | 39.6 | ⊙ | | | 38.8 | ⊙ | | | | | 29.2 | ⊙ |
| 1070 | 61.9 | 54 | | | 62.7 | 55 | 60.3 | 53 | 56.7 | 52 | 52.6 | 50 | | | 25.4 | |
| | 32.8 | ⊙ | | | 29.9 | ⊙ | 34.9 | ⊙ | 35.1 | ⊙ | 30.4 | ⊙ | | | 6.7 | ⊙ |
| 1020 | | | 61.1 | 55 | 61.2 | 50 | | | | | | | | | | |
| | | | 28.4 | ⊙ | 23.9 | ⊙ | | | | | | | | | | |
| 970 | 60.3 | 30 | 61.9 | 36 | 60.4 | 45 | | | 41.8 | | 25.4 | | NON-SUPER-CONDUCTION | | NON-SUPER-CONDUCTION | |
| | 6.9 | ⊙ | 9.7 | ⊙ | 14.9 | ⊙ | | | <4.2 | ⊙ | <4.2 | ⊙ | | | | |
| 920 | 32.8 | 20 | | | 35.1 | 20 | | | | | | | | | | |
| | <4.2 | ⊙ | | | 6.0 | ⊙ | | | | | | | | | | |
| 900 | 24.4 | | 25.4 | | 25.4 | | 25.4 | | | | 8.2 | | NON-SUPER-CONDUCTION | | NON-SUPER-CONDUCTION | |
| | <4.2 | ⊙ | <4.2 | ⊙ | <4.2 | ⊙ | <4.2 | ⊙ | | | <4.2 | ⊙ | | | | |

⊗: SUPERCONDUCTION BY $La_2CuO_4$ PHASE
⊙: SUPERCONDUCTION BY $(La, Sr, Ca)_3Cu_2O_6$ PHASE
$T_{c(mag)}^{on}$: SUPERCONDUCTION CRITICAL TEMPERATURE OBTAINED BY MEASURING MAGNETIC SUSCEPTIBILITY (DURING COOLING IN MAGNETIC FIELD)
$T_{c(R)}^{on}$: ONSET POINT OBTAINED BY MEASURING ELECTRICAL RESISTANCE (AT THE TIME OF LOWERING TEMPERATURE)
$T_{c(R)}^{zero}$: END POINT OBTAINED BY MEASURING ELECTRICAL RESISTANCE (AT THE TIME OF LOWERING TEMPERATURE)

TABLE 7

| | SINTERING TEMPERATURE (C.°) | | | | | | | | | | | | | | | |
|---|---|---|---|---|---|---|---|---|---|---|---|---|---|---|---|---|
| | 900 | | 925 | | 950 | | 970 | | 1000 | | 1030 | | 1080 | | 1130 | |
| COMPOSITION No. 5 $La_{1.6}Sr_{0.4}$ $CaCu_2O_6$ | $T_{c(R)}^{on}$ $T_{c(R)}^{zero}$ $T_{c(mag)}^{on}$ | | | | | | | | | | | | | | | |
| HIP TREATMENT TEMPERATURE (°C.) | | | | | | | | | | | | | | | | |
| 1220 | 45.4 | 41 | | | 46.9 | 42 | | | 47.6 | 46 | | | 46.3 | 44 | 44.0 | 42 |
| | 31.2 | ⊙ | | | 29.6 | ⊙ | | | 38.9 | ⊙ | | | 30.2 | ⊙ | 36.0 | ⊙ |
| 1170 | 55.9 | 44 | | | 48.1 | 42 | | | 46.2 | 44 | | | 48.8 | 41 | 40.1 | 40 |
| | 31.9 | ⊙ | | | 30.1 | ⊙ | | | 29.6 | ⊙ | | | 28.8 | ⊙ | 15.8 | ⊙ |
| 1120 | 54.9 | 46 | 44.8 | 44 | 47.8 | 44 | | | 47.3 | 44 | | | 44.9 | 40 | | |
| | 30.4 | ⊙ | 26.4 | ⊙ | 23.9 | ⊙ | | | 21.2 | ⊙ | | | 21.9 | ⊙ | | |
| 1070 | 50.1 | 48 | | | 50.7 | 48 | | | 45.5 | 42 | | | 40.3 | 36 | 22.6 | |
| | 19.9 | ⊙ | | | 20.9 | ⊙ | | | 8.9 | ⊙ | | | 7.9 | ⊙ | <4.2 | ⊙ |
| 1020 | 47.4 | 42 | 50.8 | 51 | 56.0 | 49 | | | | | | | | | NON-SUPER-CONDUCTION | |
| | <4.2 | ⊙ | <4.2 | ⊙ | <4.2 | ⊙ | | | | | | | | | | |
| 970 | | | 58.9 | 39 | 59.7 | 41 | | | 38.1 | 25 | | | | | NON-SUPER-CONDUCTION | |
| | | | <4.2 | ⊙ | <4.2 | ⊙ | | | <4.2 | ⊙ | | | | | | |
| 920 | | | | | 42.0 | 38 | | | | | | | | | | |
| | | | | | <4.2 | ⊙ | | | | | | | | | | |
| 900 | 19.6 | | 22.4 | | | | 31.3 | | | | 9.3 | | NON-SUPER- | | NON-SUPER- | |

TABLE 7-continued

| | | | | SINTERING TEMPERATURE (C.°) | | | | |
|---|---|---|---|---|---|---|---|---|
| | 900 | 925 | 950 | 970 | 1000 | 1030 | 1080 | 1130 |
| COMPOSITION No. 5 | $T_{c(R)}^{on}$ | | | | | | | |
| $La_{1.6}Sr_{0.4}$ | $T_{c(R)}^{zero}$ | | | | | | | |
| $CaCu_2O_6$ | $T_{c(mag)}^{on}$ | | | | | | | |
| | <4.2 ⊙ | <4.2 ⊙ | | <4.2 ⊙ | | <4.2 | ⊙ CONDUCTION | CONDUCTION |

⊗: SUPERCONDUCTION BY $La_2CuO_4$ PHASE
⊙: SUPERCONDUCTION BY $(La, Sr, Ca)_3Cu_2O_6$ PHASE
$T_{c(mag)}^{on}$: SUPERCONDUCTION CRITICAL TEMPERATURE OBTAINED BY MEASURING MAGNETIC SUSCEPTIBILITY (DURING COOLING IN MAGNETIC FIELD)
$T_{c(R)}^{on}$: ONSET POINT OBTAINED BY MEASURING ELECTRICAL RESISTANCE (AT THE TIME OF LOWERING TEMPERATURE)
$T_{c(R)}^{zero}$: END POINT OBTAINED BY MEASURING ELECTRICAL RESISTANCE (AT THE TIME OF LOWERING TEMPERATURE)

TABLE 8

| | | | | SINTERING TEMPERATURE (C.°) | | | | |
|---|---|---|---|---|---|---|---|---|
| | 900 | 925 | 950 | 970 | 1000 | 1030 | 1080 | 1130 |
| COMPOSITION No. 6 | $T_{c(R)}^{on}$ | | | | | | | |
| $La_{1.4}Sr_{0.6}$ | $T_{c(R)}^{zero}$ | | | | | | | |
| $CaCu_2O_6$ | $T_{c(mag)}^{on}$ | | | | | | | |

| HIP TREATMENT TEMPERATURE (°C.) | 900 | 925 | 950 | 970 | 1000 | 1030 | 1080 | 1130 |
|---|---|---|---|---|---|---|---|---|
| 1220 | 46.3 / 41 / 33.2 ⊙ | | | 47.8 / 43 / 30.4 ⊙ | 47.9 / 44 / 38.8 ⊙ | | 45.9 / 43 / 31.0 ⊙ | 41.3 / 40 / 16.3 ⊙ |
| 1170 | | | | 48.6 / 47 / 32.6 ⊙ | | | 44.4 / 41 / 28.7 ⊙ | 40.9 / 40 / 8.8 ⊙ |
| 1120 | 48.7 / 44 / 26.3 ⊙ | 49.6 / 46 / 26.0 ⊙ | | 49.4 / 44 / 24.4 ⊙ | 46.7 / 42 / 20.5 ⊙ | | 33.3 / 27 / 19.4 ⊙ | 30.9 / <4.2 ⊙ |
| 1070 | 49.4 / 47 / 24.2 ⊙ | | | 51.3 / 48 / 19.6 ⊙ | 44.8 / 40 / 8.7 ⊙ | | 25.3 / 19 / <4.2 ⊙ | NON-SUPER-CONDUCTION |
| 1020 | 43.6 / 41 / 18.2 ⊙ | | | 46.9 / 43 / <4.2 ⊙ | 22.3 / <4.2 ⊙ | 16.6 / <4.2 ⊙ | 6.2 / <4.2 ⊙ | NON-SUPER-CONDUCTION |
| 970 | 40.9 / 36 / <4.2 ⊙ | 40.6 / <4.2 ⊙ | | 40.2 / 37 / <4.2 ⊙ | | | | |
| 920 | | 22.4 / <4.2 ⊙ | | 22.8 / <4.2 ⊙ | 28.1 / <4.2 ⊙ | 22.1 / <4.2 ⊙ | 6.8 / <4.2 ⊙ NON-SUPER-CONDUCTION | |
| 900 | 18.7 / <4.2 ⊙ | 20.7 / <4.2 ⊙ | | | 27.4 / <4.2 ⊙ | | 6.1 / <4.2 ⊙ | NON-SUPER-CONDUCTION |

⊗: SUPERCONDUCTION BY $La_2CuO_4$ PHASE
⊙: SUPERCONDUCTION BY $(La, Sr, Ca)_3Cu_2O_6$ PHASE
$T_{c(mag)}^{on}$: SUPERCONDUCTION CRITICAL TEMPERATURE OBTAINED BY MEASURING MAGNETIC SUSCEPTIBILITY (DURING COOLING IN MAGNETIC FIELD)
$T_{c(R)}^{on}$: ONSET POINT OBTAINED BY MEASURING ELECTRICAL RESISTANCE (AT THE TIME OF LOWERING TEMPERATURE)
$T_{c(R)}^{zero}$: END POINT OBTAINED BY MEASURING ELECTRICAL RESISTANCE (AT THE TIME OF LOWERING TEMPERATURE)

TABLE 9

| | | | | SINTERING TEMPERATURE (C.°) | | | | |
|---|---|---|---|---|---|---|---|---|
| | 900 | 925 | 950 | 970 | 1000 | 1030 | 1080 | 1130 |
| COMPOSITION No. 7 | $T_{c(R)}^{on}$ | | | | | | | |
| $La_{1.3}Sr_{0.7}$ | $T_{c(R)}^{zero}$ | | | | | | | |
| $CaCu_2O_6$ | $T_{c(mag)}^{on}$ | | | | | | | |

| HIP TREATMENT TEMPERATURE (°C.) | 900 | 925 | 950 | 970 | 1000 | 1030 | 1080 | 1130 |
|---|---|---|---|---|---|---|---|---|
| 1220 | 40.0 / 36 / 21.9 ● | | 39.2 / 35 / 22.0 ● | | | 40.0 / 37 / 24.4 ● | 40.4 / 36 / 23.2 ● | 40.1 / 37 / 24.9 ● |
| 1170 | | | | | | | | |
| 1120 | 38.6 / 34 / 17.1 ● | 36.9 / 33 / 16.8 ● | 37.6 / 33 / 16.3 ● | | | 38.2 / 38 / 16.8 ● | 33.8 / 9.4 ● | 20.4 / <4.2 ● |
| 1070 | 38.5 / 33 / 16.2 ● | | 36.2 / 31 / 10.9 ● | | 35.7 / 30 / 9.8 ● | 26.0 / 15 / 6.7 ● | 6.9 / <4.2 ● | NON-SUPER-CONDUCTION |
| 1020 | | | | | 29.9 / 8.2 ● | | | |
| 970 | 29.3 / <4.2 ● | 30.2 / <4.2 ● | 30.0 / <4.2 ● | | 25.3 / <4.2 ● | | 8.8 / <4.2 ● | NON-SUPER-CONDUCTION |
| 920 | | 20.6 / <4.2 ● | | | | | | |
| 900 | 16.8 | | 19.0 | 19.6 | | | 8.1 | NON-SUPER- |

TABLE 9-continued

| | SINTERING TEMPERATURE (C.°) | | | | | | | |
|---|---|---|---|---|---|---|---|---|
| | 900 | 925 | 950 | 970 | 1000 | 1030 | 1080 | 1130 |
| COMPOSITION No. 7 $La_{1.3}Sr_{0.7}CaCu_2O_6$ | | $T_{c(R)}^{on}$ $T_{c(R)}^{zero}$ $T_{c(mag)}^{on}$ | | | | | | |
| | <4.2 ● | | <4.2 ● | <4.2 ● | | <4.2 ● | | CONDUCTION |

●: SUPERCONDUCTION BY $La_2CuO_4$ PHASE
⊙: SUPERCONDUCTION BY $(La, Sr, Ca)_2Cu_2O_6$ PHASE
$T_{c(mag)}^{on}$: SUPERCONDUCTION CRITICAL TEMPERATURE OBTAINED BY MEASURING MAGNETIC SUSCEPTIBILITY (DURING COOLING IN MAGNETIC FIELD)
$T_{c(R)}^{on}$: ONSET POINT OBTAINED BY MEASURING ELECTRICAL RESISTANCE (AT THE TIME OF LOWERING TEMPERATURE)
$T_{c(R)}^{zero}$: END POINT OBTAINED BY MEASURING ELECTRICAL RESISTANCE (AT THE TIME OF LOWERING TEMPERATURE)

TABLE 10

| | PRESSURIZED ATMOSPHERE | | OXYGEN GAS PRESSURE IN ATMOSPHERE ATMOSPHERE: $P_{O_2}$ (atm) | | | | | |
|---|---|---|---|---|---|---|---|---|
| | 1 | 10 | 20 | 50 | 100 | 200 | 400 | |
| COMPOSITION No. 4 $La_{1.8}Sr_{0.2}CaCu_2O_6$ | $T_{c(R)}^{on}$ $T_{c(R)}^{zero}$ $T_{c(mag)}^{on}$ | | | | | | | |
| TOTAL PRESSURE OF PRESSURIZED ATMOSPHERE | | | | | | | | |
| 2000 | | | | | 61.9 54 32.8 ⊙ | 62.1 55 32.4 ⊙ | 62.3 58 41.9 ⊙ | |
| 1000 | 17.6 10.7 ⊙ | 37.2 35 13.9 ⊙ | 47.5 44 27.4 ⊙ | | 63.1 54 26.7 ⊙ | 62.7 55 29.9 ⊙ | 02.2 57 39.6 ⊙ | |
| 200 | | | | | 62.9 53 27.1 ⊙ | | | |
| 100 | 17.6 9.3 ⊙ | 38.3 10.8 ⊙ | 46.1 43 22.3 ⊙ | 54.2 50 24.6 ⊙ | 61.1 55 26.3 ⊙ | | | |
| 50 | | | 47.0 40 21.7 ⊙ | 44.8 40 22.1 ⊙ | | | | |
| 20 | 16.6 8.9 ⊙ | | 26.8 24 13.7 ⊙ | | | | | |
| 10 | | | | | | | | |
| 1 | 8.7 <4.2 ⊙ | | | | | | | |

⊙: SUPERCONDUCTION BY $(La, Sr, Ca)_3Cu_2O_6$ PHASE
SINTERING TEMPERATURE: Ts = 950 (°C.)
HIP TREATMENT TEMPERATURE: Ta = 1070 (°C.)

We claim:

1. A method of manufacturing an oxide superconductor having a composition of the formula $La_{2-x}Sr_xCaCu_2O_6$ wherein $0<x\leq0.6$, comprising:
preliminarily burning a raw powder having a predetermined composition, and sintering the powder at a sintering temperature to obtain a sintered body; and
hot isostatic pressing the sintered body at a hot isostatic pressing temperature of 940° to 1220° C., said hot isostatic pressing temperature in an oxygen atmosphere being higher than the sintering temperature, under a total pressure of 10 MPa or more and an oxygen partial pressure of 2 MPa or more controlling a relationship between the total pressure and the oxygen partial pressure such that the oxide superconductor satisfies the following formula: $Tc^{on}(R) - Tc^{on}(mag) \geq 3.0K$ wherein $Tc^{on}(R)$ is an onset temperature point obtained by measuring electrical resistance at a time of lowering temperature, $Tc^{on}(mag)$ is the superconduction critical temperature obtained by measuring magnetic susceptibility during cooling in a magnetic field.

2. The method according to claim 1, wherein the hot isostatic pressing is performed at a total pressure of 100 MPa or more and an oxygen partial pressure of 20 MPa or more.

3. The method according to claim 1, wherein the raw powder is selected from the group consisting of $La_2O_3$, $CaCO_3$, $SrCO_3$, and $CuO$.

4. The method according to claim 1, wherein the preliminary burning is repeated in an oxygen atmosphere at a temperature of 850° to 950° C.

5. The method according to claim 1, wherein the sintering is performed in a flow of oxygen at a temperature of 925°-1200° C.

6. The method according to claim 1, wherein the hot isostatic pressing is performed at a temperature of 1070°-1220° C.

7. The method according to claim 1, further comprising quenching at a cooling rate of 400° C. or more per hour after the hot isostatic pressing.

8. An oxide superconductor having a composition of the formula $La_{2-x}Sr_xCaCu_2O_6$ wherein $0<x\leq0.6$, wherein $Ca\leq0.25$ and $Sr\leq0.15$ in $2a$ sites, and $La\leq0.2$ and $Sr\leq0.2$ in $4e$ sites, the oxide superconductor satisfying the following formula: $Tc^{on}(R) - Tc^{on}(mag) \geq 3.0K$ wherein $Tc^{on}(R)$ is an onset temperature point obtained by measuring electrical resistance at a time of lowering temperature, $Tc^{on}(mag)$ is the superconduction critical temperature obtained by measuring magnetic susceptibility during cooling in a magnetic field.

9. The oxide superconductor according to claim 8, having a superconductive critical temperature of 50K or more.

10. The method according to claim 2, wherein the raw powder comprises $La_2O_3$, $CaCO_3$, $SrCO_3$ and $CuO$; the preliminary burning is carried out at a temperature of 850° to 950° C. and the sintering is carried out in an oxygen atmosphere at a temperature of 925° to 1200° C.

11. The method according to claim 10, wherein hot isostatic pressing is carried out at a temperature of 1070° to 1220° C.

12. The method according to claim 11, which further comprises quenching at a cooling rate of 400° C. or more per hour after the hot isostatic pressuring.

13. The oxide superconductor according to claim 8 selected from the group consisting of $La_2CaCu_2O_6$, $La_{1.95}Sr_{0.05}CaCu_2O_6$, $La_{1.6}Sr_{0.4}CaCu_2O_6$, $La_{1.4}Sr_{0.6}CaCu_2O_6$ and $La_{1.3}Sr_{0.7}CaCu_2O_6$.

14. The oxide superconductor according to claim 1, wherein the hot isostatic pressing temperature is at least 40° C. higher than the sintering temperature.

15. The oxide superconductor according to claim 1, wherein x is 0.4 to 0.6 and the sintering temperature is not less than 950° C.

16. The oxide superconductor according to claim 1, wherein x is 0.4 to 0.6 and the hot isostatic pressing temperature, Ta, and the sintering temperature, Ts, satisfy the following formula; $(Ta-Ts) \leq 200°$ C.

17. The oxide superconductor according to claim 1, wherein x is 0.4 to 0.6 and the hot isostatic pressing temperature in an oxygen atmosphere is not higher than 1200° C.

18. The oxide superconductor according to claim 1, wherein x is 0.4 and the hot isostatic pressing temperature, Ta, and the sintering temperature, Ts, satisfy the following formula: $(Ta-Ts) \leq 100°$ C.

19. The oxide superconductor according to claim 1, wherein the hot isostatic pressure is carried out at a total pressure of 50 atm or higher.

* * * * *